United States Patent [19]
Saho et al.

[11] Patent Number: 5,381,666
[45] Date of Patent: Jan. 17, 1995

[54] CRYOSTAT WITH LIQUEFACTION REFRIGERATOR

[75] Inventors: Norihide Saho, Tsuchiura; Takeo Nemoto, Ibaraki; Mitsuru Saeki, Hitachi, all of Japan

[73] Assignee: Hitachi, Ltd., Tokyo, Japan

[21] Appl. No.: 710,123

[22] Filed: Jun. 4, 1991

[30] Foreign Application Priority Data

Jun. 8, 1990 [JP] Japan .................. 2-148719

[51] Int. Cl.⁶ .................. F17C 5/02; F25D 19/00; F25B 19/00
[52] U.S. Cl. .................. 62/47.1; 62/51.1; 62/298
[58] Field of Search .................. 62/6, 47.1, 51.1, 51.2, 62/51.3, 85, 298

[56] References Cited

U.S. PATENT DOCUMENTS

| | | | |
|---|---|---|---|
| 4,277,949 | 7/1981 | Longsworth | 62/47.1 |
| 4,279,127 | 7/1981 | Longsworth | 62/298 X |
| 4,543,794 | 10/1985 | Matsutani et al. | 62/47.1 |
| 4,756,167 | 7/1988 | Kuriyama et al. | 62/51.3 |
| 4,796,433 | 1/1989 | Bartlett | 62/47.1 |
| 4,854,131 | 8/1989 | Sakitani et al. | 62/51.2 |
| 4,986,077 | 1/1991 | Saho et al. | 62/51.1 |

OTHER PUBLICATIONS

Longsworth, R. C., "Interfacing Small Closed-Cycle Refrigerators to Liquid Helium Cryostats," Cryogenics, Apr. 1974, pp. 175–178.

*Primary Examiner*—Christopher Kilner
*Attorney, Agent, or Firm*—Antonelli, Terry, Stout & Kraus

[57] ABSTRACT

In a cryostat with a liquefaction refrigerator, an object to be cooled, as well as a low-temperature end of the liquefaction refrigerator for cooling the object to be cooled, is contained in a thermally-insulated vessel. The liquefaction refrigerator comprises a cooler and a refrigerator, and the cooler comprises, as main components, a heat exchanger and an expansion valve. The refrigerator includes a mechanically-operated cold-generating device. Within a vacuum vessel in the cryostat, the cooler and the refrigerator are thermally connected together by a releasable thermally-conductive member. Since the refrigerator and the cooler are separate from each other, they can be overhauled independently of each other, and the cooler can be of a compact and lightweight design. Therefore, there can be provided the cryostat which is low in running cost, and has an excellent cooling performance.

3 Claims, 10 Drawing Sheets

CRYOSTAT WITH LIQUEFACTION REFRIGERATOR

BACKGROUND OF THE INVENTION

1. Field of the Invention

This invention relates generally to a cryostat with a liquefaction refrigerator, and, more particularly, to a cryostat with a liquefaction refrigerator which contains a superconducting magnet, and can easily condense evaporation gas of liquefied gas, with the cryostat being suited for use in a supermagnetic resonance image pickup device or the like.

2. Description of the Prior Art

In a conventional cryostat with a liquefaction refrigerator, particularly, a nuclear magnetic resonance device (hereinafter referred to as "MRI") used in a medical field for the diagnosis of a human body, as disclosed in Japanese Patent Unexamined Publication No. 62-299005, a superconducting magnet (hereinafter referred to as "magnet") is employed for obtaining a uniform high magnetic field. Therefore, a vacuum-insulated cryostat for containing the magnet in a cooling condition is needed.

The magnet is cooled by dipping it in a cryogenic cooling medium, e.g. liquid helium, so that the magnet can be maintained in a superconducting condition. The liquid helium is gradually evaporated by the heat intruding from an ordinary-temperature vacuum vessel of the cryostat into the cryostat, and therefore it is necessary to periodically replenish or pour liquid helium. If the amount of evaporation of the liquid helium is reduced, and if it is re-liquefied in the cryostat, the pouring of the liquid hellium is unnecessary, and the operating cost is greatly reduced.

Therefore, in the prior art, a liquid refrigerator includes a refrigerator for cooling a thermal shield plate within the cryostat, and a liquefaction cooler fixedly mounted in the vacuum within the cryostat so as to cool the liquid helium to a liquefaction temperature, utilizing the cold of the refrigerator.

Also, in the prior art, helium gas, compressed by a compressor unit of the oil lubricating type mounted within an ordinary-temperature room, is supplied to the liquefaction cooler B, and the supplied helium gas contains impurities, such as oil components, $N_2$, $O_2$ gas and $CO_2$ gas, whose concentration is several ppm.

The refrigerator is mounted within a sleeve fixedly mounted on the thermal shield plate within the cryostat, and a heat exchange between a cold station of the refrigerator and the wall of the sleeve is effected through helium gas filled and sealed in the sleeve.

The refrigerator and the liquefaction cooler both receive operating gas (e.g. high-pressure helium gas) from the compressor mounted within the ordinary-temperature portion, and therefore impurities, such as oil, $H_2O$, $CO_2$, $N_2$ and $H_2$ gas, are accumulated in cooling portions of the refrigerator and the liquefaction cooler, and they must be overhauled periodically.

Those constituent elements of the refrigerator which require the overhaul are a displacer (washing of the deposited cooling material) of a reciprocating-type expander, such as Gifford-McMahon and Solbey cycle, a seal ring (exchange) provided at the cooling portion, and etc. Those constituent elements of the liquefaction cooler which require the overhaul are a heat exchanger (washing of its interior), a Joule Tomson valve (washing of its interior), and etc. In the above prior art construction, the displacer of the refrigerator can be easily withdrawn, with its cylinder portion left in the cryostat, and its overhaul can be easily accomplished; however, since the liquefaction cooler is fixedly mounted within the liquefaction cryostat, the cooler must be removed after the vacuum in the cryostat is once returned to an atmospheric pressure.

However, to carry out this operation, a liquid helium vessel must be once returned to an ordinary temperature, and the removal of the liquid helium from this vessel, the heating, the re-pouring of liquid helium after the overhaul and the re-cooling are needed, results in an increased cost for the overhaul.

The cycle of overhaul of the liquefaction cooler is determined by the concentration of the impurities in the operating fluid of the liquefaction cooler. The higher impurity concentration, the sooner the overhaul cycle, and the overhaul cost is high, thereby resulting in an increase in the overall operating cost.

The heat exchange between the cold station of the refrigerator and the wall of the sleeve is carried out by the thermal conduction of the stationary helium gas filled therebetween. Therefore, the thermal resistance of the helium gas layer is large, so that the temperature difference between the cold station of the refrigerator and the sleeve wall is large. As a result, the amount of evaporation of the liquid helium is increased due to the insufficient cooling of the thermal shield plate, and also the liquid surface of the liquid helium in the liquid helium vessel is lowered due to the insufficient cooling of the liquefaction cooler thermally integrated with the sleeve wall. As a result, it becomes necessary to re-pour the evaporation gas of the liquid helium gas, thus increasing the operating cost, and also the superconducting magnet is exposed to the liquid surface, so that its superconducting condition is quenched because of its temperature rise. Thus, the reliability of the cryostat is lowered.

SUMMARY OF THE INVENTION

In view of the above problems of the prior art, it is an object of this invention to provide a cryostat with a liquefaction refrigerator, containing a superconducting magnet, in which the refrigerator and the liquefaction cooler are separate from each other so that they can be overhauled independently of each other, and the overhaul can be carried out at low costs.

Another object of this invention is to provide a cryostat with a liquefaction refrigerator which can be overhauled at low costs, and the liquefaction cooler can be of a compact and lightweight design, and can be manufactured at low costs.

A further object of the invention is to provide a cryostat with a liquefaction refrigerator which can be overhauled at low costs, and has an excellent cooling ability, and is highly reliable in operation.

To achieve the above objects, in a cryostat with a liquefaction refrigerator according to the present invention, a liquefaction cooler is detachably mounted in a liquid helium supply port, and is thermally connected to a refrigerator by a thermally-conductive member before-hand mounted in the interior of the cryostat.

More specifically, according to the present invention, the liquefaction refrigerator is separated into a cooler and a refrigerator, and the cooler comprises, as main components, a heat exchanger and an expansion valve, and the refrigerator includes mechanically-operated cold-generating means, and within a vacuum vessel in the cryostat, the cooler and the refrigerator are thermally connected together by releasable thermally-conductive means. In another form of the invention, the liquefaction refrigerator is separated into a refrigerator for cooling a thermal shield plate and a cooler for cooling a liquefaction circuit. In a further form of the invention, the liquefaction refrigerator comprises a cooler and a refrigerator, and the cooler can be detached independently. In yet another form of the invention, the liquefaction refrigerator is a liquefaction device constituted solely by a JT circuit, and a high-pressure side of the liquefaction refrigerator is subjected to an operating pressure of less than 10 kg/cm$^2$. In this case, preferably, in addition to the liquefaction refrigerator, another refrigerator should be provided for cooling the shield plate.

Preferably, a port into which the cooler is inserted is provided in the vacuum vessel in the cryostat in isolated relation to the vacuum chamber, and a cryogenic-temperature portion of the port is integrated by thermally-conductive means with an evaporation gas-condensing surface provided in the liquid helium vessel.

Preferably, the cooler is mounted in the liquid helium supply port or an evaporation gas discharge port, and the cooler is thermally connected to the refrigerator through a wall of the supply port or the discharge port, and a cryogenic-temperature portion of the cooler is exposed to a gas-phase portion in the liquid helium vessel.

In the present invention, the thermally-conductive member is fixedly mounted on the wall of the cooler-mounting port or the liquid helium supply port, and the portion of the liquefaction cooler to be cooled is thermally connected to the thermally-conductive member via the wall of the liquid helium supply port, and the operating gas in the liquefaction cooler can be easily cooled to a cryogenic temperature by the cold of the refrigerator, thereby producing the intended cryogenic temperature easily.

When the overhaul is to be carried out (that is, when a trouble occurs only in the liquefaction cooler), the cooler is withdrawn in such a manner that the atmosphere will not flow into the liquid helium supply port, and the interior of the liquefaction cooler is washed at an ordinary temperature. Then, the cooler can be again attached to the liquid helium supply port. At this time, the refrigerator can be continued to operate, and therefore even during the time when the liquefaction cooler is detached, the amount of evaporation of the liquid helium within the cryostat can be kept to a minimum. Further, since there is no need to destroy the vacuum of the cryostat at the time of overhaul of the liquefaction cooler, the cost required for the overhaul is greatly reduced.

Further, according to the present invention, there is no need to incorporate a self-cooling refrigerator in the liquefaction cooler, and therefore the liquefaction cooler can be of a compact and light-weight construction, and besides the manufacturing cost of the liquefaction cooler as well as the overhaul cost can be reduced greatly.

Further, to achieve the above objects, according to the present invention, there is provided a cryostat with a liquefaction refrigerator wherein an object to be cooled, as well as a low-temperature end of the liquefaction refrigerator for cooling the object to be cooled, is contained in a thermally-insulated space. The liquefaction refrigerator comprises a cooler and a refrigerator, and a communication passage is provided between a low-temperature end of the refrigerator and an ordinary-temperature end of the cooler so as to supply an operating fluid, flowing from said low-temperature end in a divided manner, to the cooler.

The cooler may be mounted in a cooling medium supply portion provided in the thermally-insulated space. The liquefaction refrigerator may comprise a cooler and a refrigerator for cooling the thermal shield member, and the cooler and the refrigerator are releasably connected to a thermally-conductive member provided in the thermally-insulated space. The cooler may be independently releasably mounted in the thermally-insulated space.

In another form of the invention, the cooler may comprise, as main components, a heat exchanger and an expansion valve, and the refrigerator may include mechanically-operated cold-generating means. A communication passage supplies an operating fluid, flowing from a low-temperature end of the refrigerator in a divided manner, from an ordinary-temperature end of the cooler, and, within the thermally-insulated space, the cooler and the refrigerator may be thermally connected together by releasable thermally-conductive means.

In a further form of the invention, the refrigerator is inserted in a sleeve isolated from the thermally-insulated space, and gap is provided between the sleeve and the refrigerator, with the operating fluid flowing through the gap. An adsorbent may be provided in the communication passage, or an adsorbent may be provided in the low-temperature end of the refrigerator.

In a further form of the invention, warming means warms an operating fluid, flowing from a low-temperature end of said refrigerator in a divided manner, to an ordinary-temperature, and a communication passage supplies the warmed operating fluid from an ordinary-temperature end of the cooler, and, within said thermally-insulated space, the cooler and the refrigerator are thermally connected together by releasable thermally-conductive means. The warming means may comprise a thermal shield member provided in the thermally-insulated space, or an insertion tube provided in the thermally-insulated space, with the cooler being inserted in the insertion tube.

In other forms of the invention, a compressor supplies the operating fluid to the refrigerator at an ordinary-temperature portion, and an adsorbent device adsorbs impurities in the operating fluid at a low-temperature end of the refrigerator disposed in said thermally-insulated space. A communication passage supplies the operating fluid, passed through the adsorbent device, from an ordinary-temperature end of the cooler. The cooler may contain an adsorbent, and the operating fluid is supplied from a compressor, mounted on the ordinary-temperature portion, to the ordinary-temperature end of the cooler. The operating fluid, having a higher purity than the operating fluid supplied to the ordinary-temeprature end of the refrigerator, may be supplied to the ordinary-temperature end of the cooler, and within said thermally-insulated space, the cooler and the refrigerator may be thermally connected by releasable thermally-conductive means.

With the above construction, the operating fluid within the cooler can be easily cooled to a cryogenic temperature by the cold of the refrigerator.

In the present invention, when the overhaul is to be carried out, that is, when trouble occurs only in the cooler, the cooler is withdrawn in such a manner that the atmosphere will not flow into the cooling medium supply port, and the interior of the cooler is washed at an ordinary temperature. Then, the cooler can be again attached to the cooling medium supply port. At this time, since the refrigerator can be continued to operate, the amount of evaporation of the liquid helium in the cryostat can be maintained at a minimum even during the time when the cooler is detached. Further, since there is no need to destroy the vacuum of the refrigerator at the time of overhaul of the cooler, the cost required for the overhaul can be reduced greatly.

Further, since there is no need to incorporate a self-cooling refrigerator in the cooler, the cooler can be of a compact and lightweight design, and besides the manufacturing cost of the cooler as well as the overhaul cost can be greatly reduced.

For example, the helium gas, extracted from the low-temperature portion of the refrigerator (that is, the high-pressure helium gas containing an extremely small amount of impurities) can be supplied as the operating fluid for the cooler in an ordinary-temperature condition. Therefore, the cooler can be independently separated, and the cost required for the overhaul can be reduced.

Further, since the operating fluid, extracted from the low-temperature portion of the refrigerator, always flows through the sleeve of the refrigerator, the thermal resistance between the refrigerator and the wall of the sleeve is decreased to an extremely small value because of an increased heat transfer between this operating fluid and the sleeve wall. As a result, the cooling temperature of the thermal shield member is further lowered, thereby decreasing the amount of evaporation of the cooling medium, and also the cooling temperature of the cooler is further lowered, so that the liquefaction cooling performance of the cooler is enhanced. Therefore, the amount of electric power consumed by the compressor of the liquefaction refrigerator can be reduced, and the operating cost can be reduced.

DETAILED DESCRIPTION OF THE PREFERRED EMBODIMENTS

Figure 1:
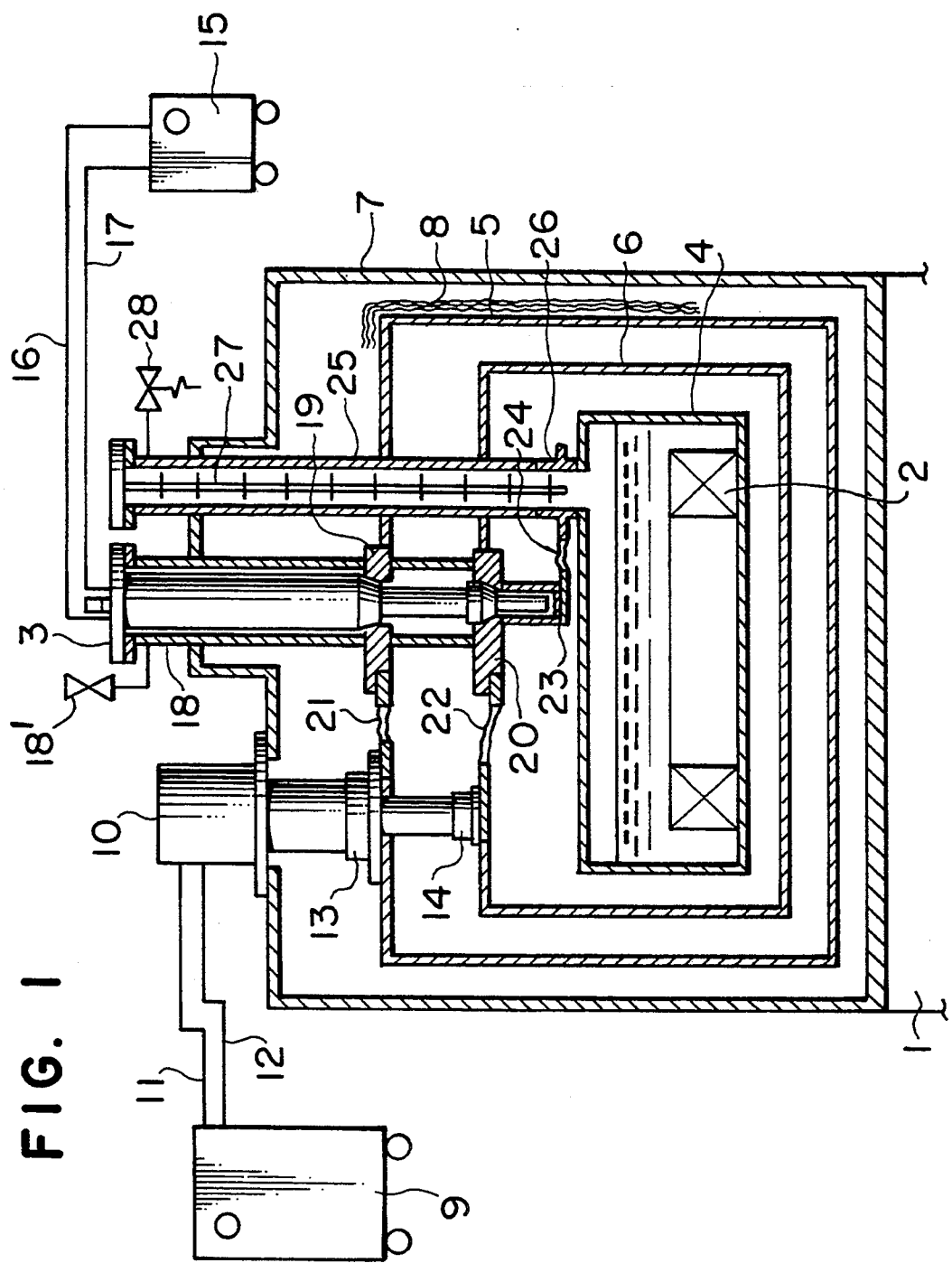
FIG. 1 is a cross-sectional view of a cryostat with a liquefaction refrigerator according to a first embodiment of the present invention.

As shown in FIG. 1, a cryostat has at a central portion thereof a cavity portion 1 in communication with the atmosphere and being adapted to receive therein an object to be detected. The cryostat contains a liquid helium vessel 4 containing a superconducting magnet 2, i.e., object to be cooled, and thermal shield tubes 5, 6, i.e. other objects to be cooled, of a plurality of temperature levels (In this embodiment, two temperature levels, that is, about 70K and about 15K). The interior of the cryostat is isolated from the atmosphere by a vacuum vessel 7, and the interior of the cryostat is thermally vacuum-insulated, for example, by winding a laminated thermal insulating material 8 thereon.

A refrigerator, for example, of the Solbey type, Gihord-McMahon type or the like, comprises a compressor unit 9 serving as gas pressure source, an expander 10 of the piston reciprocating-type, a high-pressure pipe 11, and a moderate-pressure pipe 12, with the two pipes 11 and 12 interconnecting the compressor unit 9 and the expander 10. A low-temperature portion of the expander 10 is received in the cryostat, and its first stage 13, cooled to a temperature of 70K, is thermally integrated with the thermal shield tube 5, and its second stage 14, cooled to a temperature of about 15K, is thermally integrated with the thermal shield tube 6.

A cooler, containing a heat exchanger and a Joule Thomson valve (hereinafter referred to as "JT valve") therein, comprises a compressor unit 15 serving as gas pressure source, a high-pressure pipe 16, and a low-pressure pipe 17. The cooler is inserted into an insertion port 18, and its low-temperature portion is thermally integrated with a first low-temperature flange 19 and a second low-temperature flange 20 via contacting members of an indium foil or the like.

The first and second low-temperature flanges 19 and 20 are respectively thermally integrated with the first and second stages 13 and 14 of the expander 10 through thermally-conductive members (e.g. copper wire) 21 and 22, and are cooled to respective temperature of 70K and 15K by the cold of the expander 10. Gas helium under a pressure, generally equal to the atmospheric pressure, is filled in the insertion port 18 via a valve 18'.

A thermally-conductive member 24, and a liquid helium supply port 25 are also provided. The liquid helium supply port 25 has a stainless steel, but is made of copper portion at a heat transfer surface 26 at its lower end portion which performs a condensing function. A radiant heat-preventing rod 27 and disk-shaped reflection plates, of a high radiant ability, are mounted on the rod 27 in a plurality of stages. This radiant heat-preventing member is removed or withdrawn from the liquid helium supply port 25 when liquid helium is to be poured, and may usually close this supply port.

Figure 2:
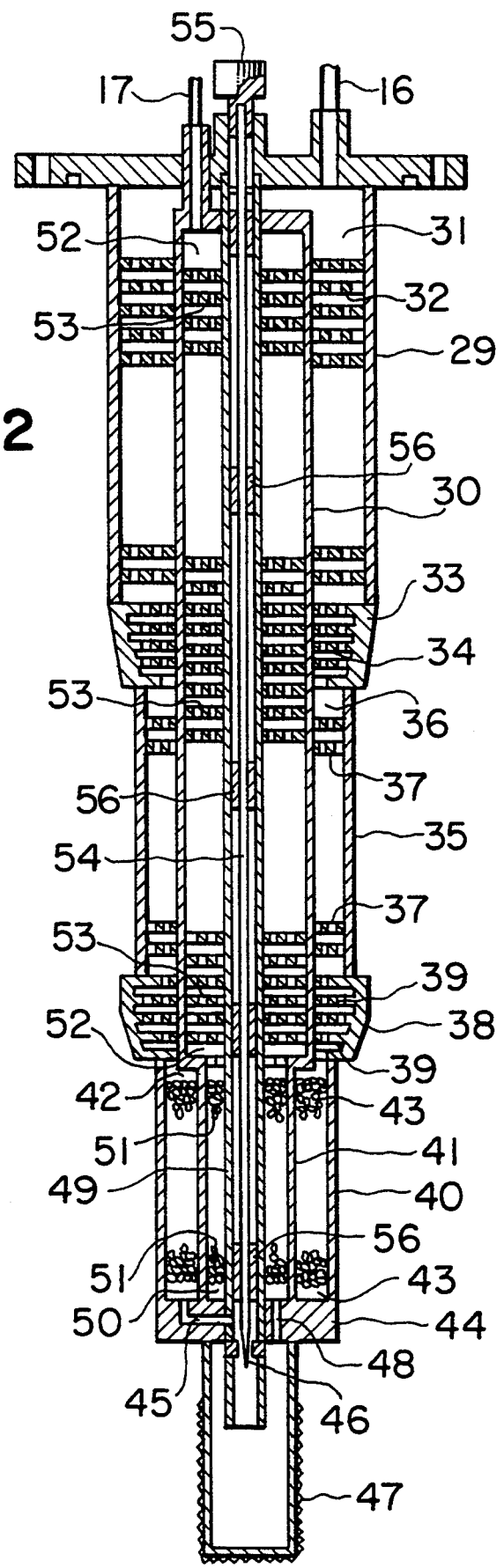
FIG. 2 is a cross-sectional view of a cooler used in the cryostat of FIG. 1.

As shown in FIG. 2, a space 31 is formed between an upper outer tube 29 of a low-thermal conductivity material, e.g. stainless steel, and an upper inner tube 30 of a high-thermal conductivity material, e.g. phosphorus deoxidized copper, and a plurality of disk-shaped perforated heat transfer plates 32, made of a high-thermal conductivity material, e.g. oxygen-free copper, are provided in the space 31 and are stacked in the axial direction. The perforated plates 32 are thermally integrated with the outer surface of the upper inner tube 30 by soldering, silver-soldering, diffusion bonding, or the like. In FIG. 2, for the sake of clarity, some of the perforated plates 32 are omitted intermediate the direction of stack. A first heat station 33 of oxygen-free copper is mounted on the lower end of the upper outer tube 29, and the connecting portions are hermetically integrated with each other by welding or the like. The outer surface of the first heat station 33 has a conical shape, and can be held in good thermal contact with an inner conical surface of the first cooling flange 19.

The first heat station 33 has integral perforated plates 34 formed therein in a multi-stage manner, and the perforated plates 34 may not always be required to be thermally integrated with the upper inner tube 30. Provided beneath the lower end of the first heat station 33 is a space 36 formed between an intermediate outer tube 35 of stainless steel and the upper inner tube 30, and a plurality of perforated heat transfer plates 37 of oxygen-free copper are stacked in the space 36 in the axial direction, with the perforated plates 37 being thermally integrated with the outer surface of the upper inner tube 30. For the sake of clarity, some of the perforated plates 37 are omitted intermediate the direction of stack.

The first heat staion 33 is integrally connected hermetically to the upper end of the intermediate outer tube 35. A second heat station 38 of oxygen-free copper is mounted on the lower end of the intermediate outer tube 35, and the connecting portions are hermetically integrated with each other. The second heat station 38 has integral perforated plates 39 formed therein in a multi-stage manner, and the perforated plates 38 may not always be required to be thermally integrated with the upper inner tube 30. A lower outer tube 40 of stainless steel is hermetically integrally connected to the lower end of the second heat station 38.

The outer surface of the second heat station 38, like the outer surface of the first heat station 33, has a conical shape, and can be held in good thermal contact with an inner conical surface of the second low-temperature flange 20. Provided beneath the lower end of the second heat station 38 is a space 42 formed between the lower outer tube 40 and a lower inner tube 41, and perforated sintered elements 43 of copper in the form of fine grains are filled in the space 42 continuously in the axial direction, with the perforated sintered elements 43 being thermally integrated with the outer surface of the lower inner tube 41. In FIG. 2, for the sake of clarity, some of the perforated sintered elements are omitted intermediate the axial direction.

The lower outer tube 40 and the lower inner tube 41 are integrally connected at their lower ends to a flange 44, and the space 42 is communicated with the JT valve 46 via a communication hole 45. The outlet of the JT valve communicates with a gas-liquid separator 47, and the upper portion of this separator communicates with the interior of the lower inner tube 41 via a communication hole 48. A space 50 is formed between the lower inner tube 41 and a rod tube 49 of stainless steel for the JT valve, and perforated sintered elements 51 of copper, in the form of fine grains, fill the space 50 continuously in the axial direction, with the perforated sintered elements 51 being thermally integrated with the inner surface of the lower inner tube 41. In FIG. 2, for the sake of clarity, some of the perforated sintered elements are omitted intermediate the axial direction. A space 52 is formed between the upper inner tube 30 and the JT valve rod tube 49, and perforated heat transfer plates 53 of copper are stacked in the space 52 in the axial direction, with the perforated plates 53 being thermally integrated with the inner surface of the upper inner tube 30. Some of the perforated plates 53 are, for the sake of clarity, omitted intermediate the direction of stack.

The upper end of the space 52 communicates with the low-pressure pipe 17. A needle at a lower end portion of a rod 54 is moved upward and downward by a screw 55 so as to adjust the degree of opening of the JT valve. The elongated rod 54 is guided by cylindrical tubes 56 made of a material of a very low thermal conductivity, such as, for example, a plastics material.

The first heat station 33 is cooled by the first low-temperature flange 19 to a temperature of about 70K, and the second heat station 38 is cooled by the second low-temperature flange 20 to a temperature of about 15K. High-pressure helium gas flows from the upper end of the space 31 into the cooler, and is cooled to a temperature of about 6K while passing through the perforated heat transfer plates 32, 34, 37 and 39 and the perforated sintered elements 43, and then flows into the JT valve 46. The helium gas is expanded at the JT valve, and thereafter liquid helium, resulting from low-pressure helium mists having a temperature of about 4.3K, resides in the lower portion of the gas-liquid separator 47 to cool the wall of the gas-liquid separator 47, and a lowermost portion 23 of the insertion port is cooled by this cold. The low-pressure helium gas and the evaporation gas of the liquid helium flow through the communication hole 48, and are converted into ordinary-temperature low-pressure gas while cooling the perforated sintered elements 51 and the perforated heat transfer plates 53, and then is discharged from the cooler through the upper end of the space 52, and is returned to the low-pressure pipe 17.

The lowermost portion 23 of the insertion port cooled to the liquid helium temperature is thermally integrated with a cooling member 26, provided at the lower end of the liquid helium supply port 25 of the liquid helium vessel 4, through the thermally-conductive members 24 such as copper wires. The cooling member 26 is made of a material of good thermal conductivity, such as copper, and is hermetically integrated, for example, by friction press-fitting, with the cylindrical portion of stainless steel, which constitutes the upper portion of the liquid helium supply port 25, and also with a throat portion, made of stainless steel, of the liquid helium vessel 4 which constitutes the lower portion of the liquid helium supply port 25. Since the interior of the liquid helium supply port 25 is filled with the evaporated helium gas, the heat intrudes from the ordinary-temeprature portion to the cryogenic-temperature portion due to the convection of the gas. Therefore, a convection-preventing plate 27 is inserted in the liquid helium supply port 25. A safety valve 28 is connected to the upper section of the liquid helium supply port 25, and if the pressure within the liquid helium vessel 4 should rise to a predetermined level, the evaporation gas is discharged therefrom to the atmosphere.

The gas helium, evaporated in the liquid helium vessel, is re-liquefied on the inner surface of the cooling plate 26 of a cryogenic temperature, and is returned as liquefied helium to the vessel 4. Therefore, the pressure within the liquid helium vessel 4, as well as the liquid surface within this vessel, is kept constant, and there is no need to replenish liquid helium.

High-boiling materials, for example, impurities such as oil, $H_2O$, $CO_2$, $O_2$, $N_2$ and $H_2$ gas, carried from the compression units 9 and 15 by the helium gas flow into the refrigerator and the cooler, are accumulated in their respective cooling portions. However, since the temperature of the cooler becomes as low as the liquid helium temperature, troubles by the impurities, such as the deterioration of the heat transfer performance due to the deposition of such impurities on the surfaces of the heat transfer plates and sintered elements within the heat exchanger, and the clogging of the JT valve, occur more frequently at the cooler than at the refrigerator.

When such trouble occurs in the cooler, the cooler is removed, and its interior is cleaned by high-purity gas helium at an ordinary temperature so as to remove the impurities. Thereafter, the cooler is again inserted into the insertion port 18, and this port is evacuated to vacuum through the valve 18', and the cool-down operation is carried out while cooling the cooler itself by the cold of the first and second low-temperature flanges 19 and 20. At this time, by the vacuum evacuation of the port 18, the warming of the lowermost portion 23 during the cool-down operation can be prevented as much as possible. After this cool-down operation, helium gas is filled in the port 18 via the valve 18', thereby restoring the cooler into a normal condition.

Therefore, in this embodiment, when the cooler is to be overhauled, this can be done while continuing the operation of the refrigerator. Consequently, even when the cooler is detached, the temperature increase of the thermal shield tubes can be prevented, and also a large increase of the amount of evaporation of the liquid helium can be prevented. Furthermore, when the cooler is to be removed, there is no need to destroy the vacuum condition of the cryostat, and, advantageously, the cost required for the overhaul can be greatly reduced.

Further, since there is no need to incorporate a self-cooling refrigerator in the cooler, the cooler can be of a compact and lightweight design, and the manufacturing cost can be reduced, and the cost for the overhaul of the cooler itself can be reduced.

Figure 3:
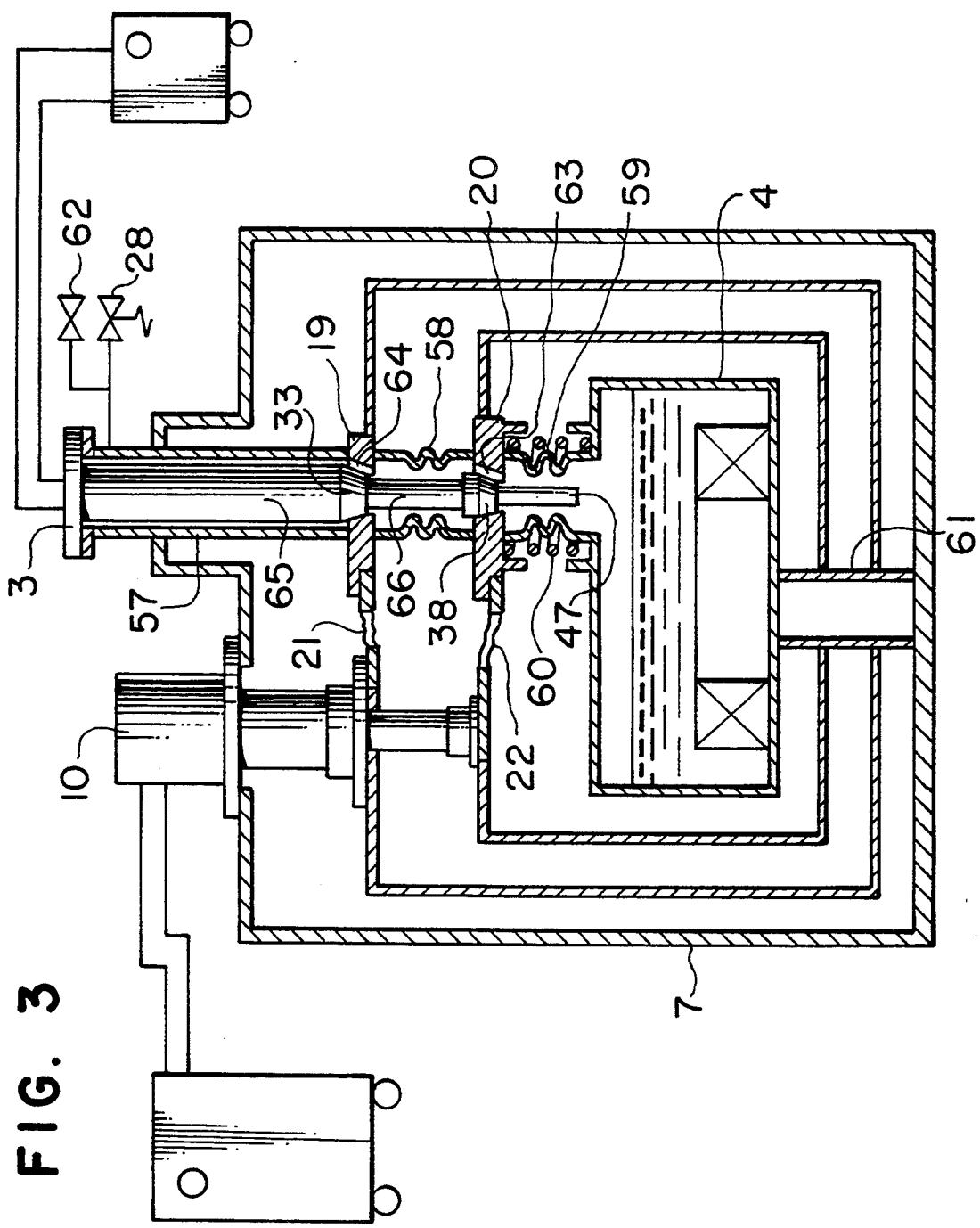
FIG. 3 is a cross-sectional view of a second embodiment of the invention.

The embodiment of FIG. 3 differs from the embodiment of FIG. 1 in that a cooler 3 can be mounted in a liquid helium supply port 57. Therefore, first and second cooling flanges 19 and 20, cooled by a refrigerator are mounted on the supply port 57 intermediate the opposite ends of this supply port, and that portion of the wall of the supply port 57, extending between the first and second low-temperature flanges 19 and 20, is constituted by an elastic bellows 58, and similarly that portion of the wall of the supply port 57 extending between the second low-temperature flange 20 and a liquid helium vessel 4 is constituted by an elastic bellows 59. A spring 60 is mounted on the outer periphery of the bellows 59, so that first and second heat stations 33 and 38 of the cooler are maintained in good thermal contact with the first and second low-temperature flanges 19 and 20, respectively.

Although omitted from FIG. 1, the liquid helium vessel 4 is supported by a wall of a vacuum vessel 7 through a load support member of an epoxy resin.

In this embodiment, since the insertion port for the cooler and the liquid helium supply port are integrated, one structural member which provides thermal conductivity between the ordinary temperature and the liquid helium temperature is omitted, and the intrusion of the heat into the liquid helium vessel is reduced, so that the cooling amount required for the cooler can be reduced, which enables a more compact construction. Further, since an outer surface of a gas-liquid separator 47 is in direct contact with the gas phase within the liquid helium vessel 4, the evaporation gas within the liquid helium vessel can be efficiently re-liquefied. Further, during the cool-down operation of the cooler, the evaporation gas within the liquid helium vessel 4 is discharged to the atmosphere via grooves 63 and 64 by opening a valve 62, so that the cooler can be cooled by the heat of the evaporation gas in short time. Therefore, advantageously, the cool-down time for the cooler can be greatly shortened.

In the present invention, the cooler has the function of re-liquefying the evaporation gas without the provision of any mechanically-operated cold-generating means therein, and this cooler can be provided separately from the refrigerator for cooling the thermal shield tubes. Therefore, the following advantages can be achieved:

Since only the cooler can be overhauled without stopping the operation of the refrigerator, a large increase of the amount of evaporation of the liquid helium at this time can be prevented, and the maintenance cost can be greatly reduced. Since only the cooler can be detached without destroying the vacuum of the cryostat, the maintenance cost can be reduced greatly. The cooler can be mounted in the liquid helium supply port, and, therefore, after the cooler is attached, a cooler of an ordinary temperature can be pre-cooled directly by the evaporation gas of the liquid helium, and therefore the cool-down time for the cooler can be shortened. Further, since no mechanically-operated cold-generating means is incorporated in the cooler, the manufacturing cost for the cooler can be reduced.

Figure 4:
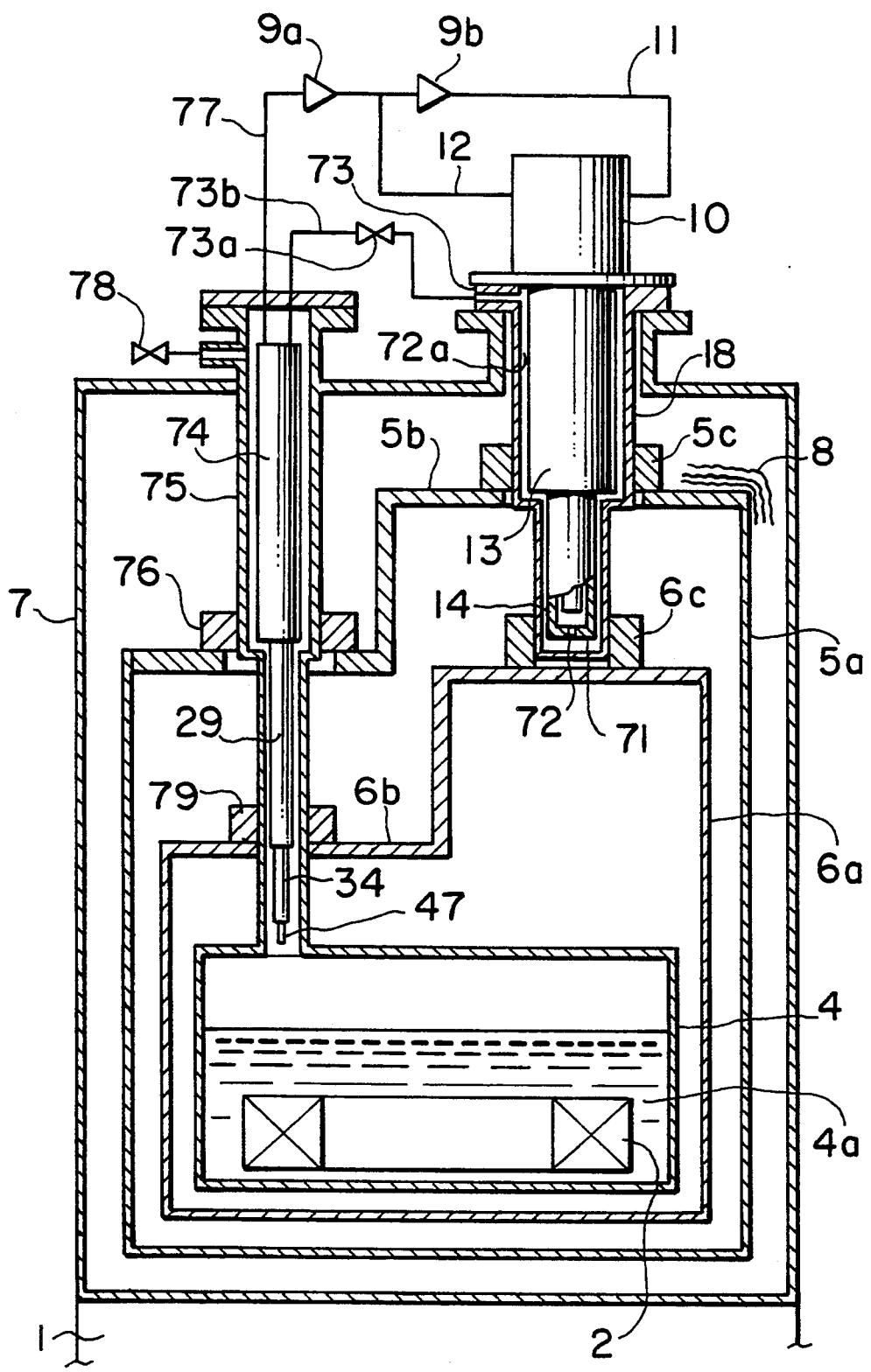
FIG. 4 is a cross-sectional view of a third embodiment of the invention.

FIG. 4 provides an example of embodiment of the invention, wherein a cryostat has at its central portion a cavity portion 1 communicating with the atmosphere and adapted to receive therein an object to be detected. The cryostat contains a liquid helium vessel 4 containing a super-conducting magnet 2 serving as object to be cooled and liquid helium 42, i.e. cooling medium, and thermal shield tubes 5a and 6a serving as other objects to be cooled at a plurality of temperature levels. In the embodiment of FIG. 4, two temperature levels are provided, that is, about 70K and about 15K. The interior of the cryostat is isolated from the atmosphere by a vacuum vessel 7, and the interior of the cryostat is thermally vacuum-insulated, for example, by winding a laminated thermal insulating material 8 there around.

A refrigerator, for example, of the Solvay type comprises compressors 9a and 9b, serving as gas pressure source, an expander 10, of the piston reciprocating-type, a high-pressure pipe 11, and a moderate-pressure pipe 12, with the two pipes 11 and 12 interconnecting the compressors 9a and 9b the expander 10. A low-temperature portion of the expander 10 is received in the cryostat, and its first cold stage 13, cooled to a temperature of 70K, is thermally integrated with the thermal shield tube 5a through thermally-conductive members 5b and 5c, and its second cold stage 14, cooled to a temperature of about 15K, is thermally integrated with the thermal shield tube 6a through thermally-conductive members 6b and 6c.

The expander 10 is mounted in a sleeve 18 serving as insertion port. The interior of the sleeve 18 is isolated from the interior of the vacuum vessel 7. Helium gas of low temperature and high pressure, flowing from a narrow hole 72 formed in a cylinder 71 of the second cold stage 14 of the expander 10, flows through a gap 72a, formed between the sleeve 18 and the second and first cold stages 14, 13, toward a high-temperature side, and further flows through a narrow hole 73 in an ordinary-temperature portion, a valve 72a and a pipe 73b, and is supplied to a cooler 74 mounted in an insertion port 75.

Figure 8:
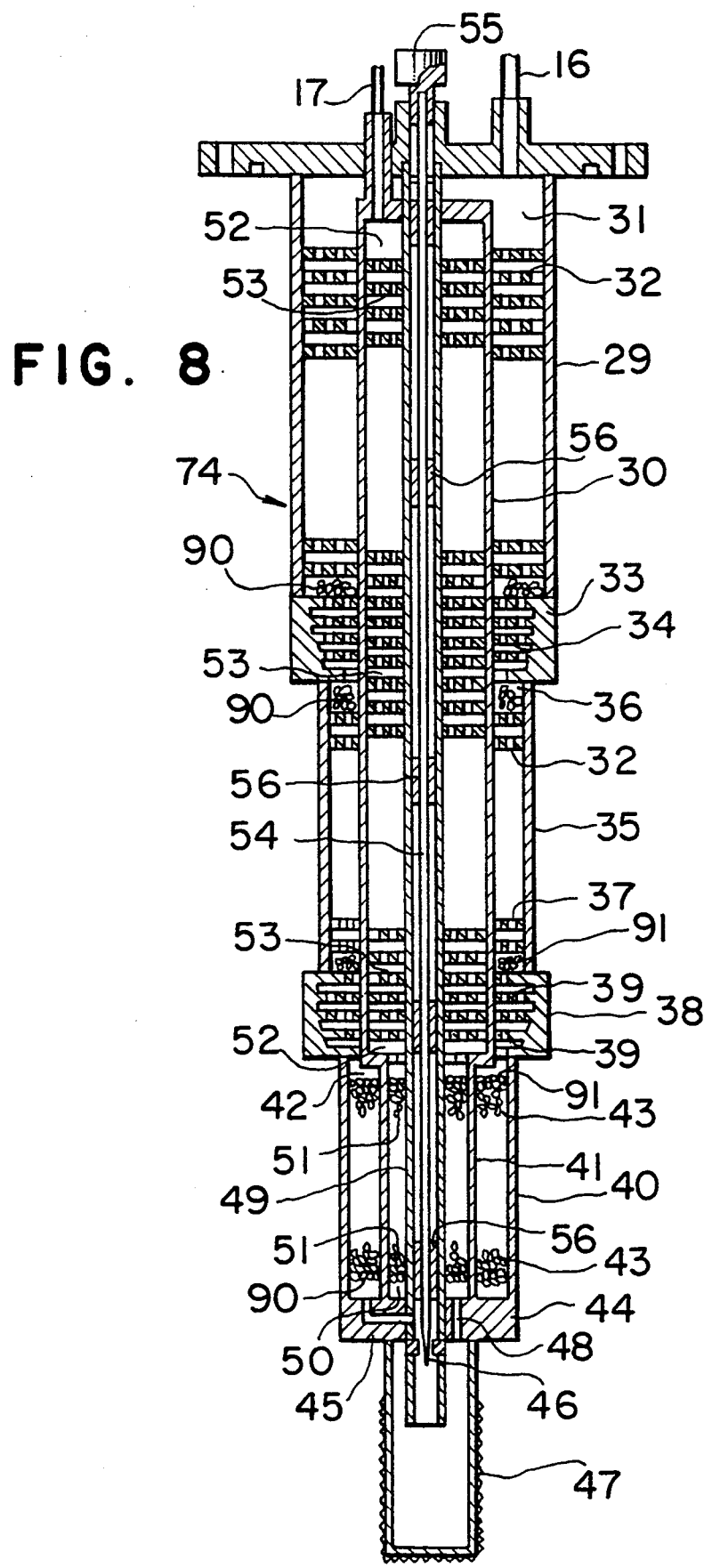
FIG. 8 is a cross-sectional view of a cooler B used in a seventh embodiment of the invention.

The cooler 74 used in this embodiment is the same as the cooler in FIG. 2. The cooler 74 has a construction as shown in FIG. 2. A space 31 is formed between an upper outer tube 29 of a low-thermal conductivity material (e.g. stainless steel) and an upper inner tube 30 of a high-thermal conductivity material (e.g. phosphorus deoxidized copper), and a plurality of disk-shaped perforated heat transfer plates 32, of a high-thermal conductivity material, e.g. oxygen-free copper, are provided in the space 31 and are stacked in the axial direction. The perforated plates 32 are thermally integrated with the outer surface of the upper inner tube 30 by soldering, silver-soldering, diffusion bonding, or the like. In FIG. 8, for the sake of clarity, some of the perforated plates 32 are omitted intermediate the direction of stack. A first heat station 33, of oxygen-free copper, is mounted on the lower end of the upper outer tube 29, and the connecting portions are hermetically integrated with each other by welding or the like. The outer surface of the first heat station 33 has a cylindrical shape, and a clearance between this outer surface and an inner surface of a first low-temperature flange 76 (FIG. 4) is not greater than 100 $\mu$m so that a good heat exchange therebetween can be carried out by the thermal conduction of the helium gas residing in the insertion port 75.

As shown in FIG. 4, a gas-liquid separator 47, cooled to a liquid helium temperature, is exposed to a gas-phase portion of the liquid helium vessel 4, and the evaporation gas within this vessel is re-liquefied upon contact with the outer surface of the gas-liquid separator 47, so that the pressure within the liquid helium vessel 4, as well as the liquid surface within this vessel, is kept constant. Therefore, there is no need to replenish liquid helium. A helium gas supply valve 78 supplies helium gas when the cooler 74 is detached.

The helium gas, supplied to the pipe 73b and the cooler 74, comes from the low-temperature end of the refrigerator, and the concentration of the impurities is lower there than at the ordinary-temperature inlet portion of the refrigerator, and this concentration is very low on the order of several ppb. Therefore, the amount of the impurities deposited on the heat transfer surfaces and the JT valve in the cooler is very small, and problems such as the lowering of the heat transfer performance and the clogging of the JT valve are minimized. Therefore, the time period between overhauling of the cooler 74 is long, and the cost for the overhaul as well as the operating cost can be reduced.

If any problem occurs in the cooler 74, the cooler 74 may be detached and its interior cleaned by high-purity helium gas at an ordinary temperature so as to remove the impurities, and the cooler is again mounted in the insertion port 75. And, during the cool-down operation, the refrigerator can be operated. Therefore, even during the time when the cooler 74 is detached, the temperature increase of the thermal shield tubes can be prevented, and a large increase of the amount of evaporation of the liquid helium can be prevented. Further, when the cooler 74 is detached, there is no need to destroy the vacuum in the cryostat, and the cost for the overhaul can advantageously be greatly reduced.

There is no need to incorporate a self-cooling refrigerator in the cooler 74, and the cooler 74 can be of a compact and lightweight design, and the manufacturing cost can be reduced, and the cost for the overhaul of the cooler 74 itself can be reduced.

When the cooler 74 is to be remounted, the first low-temperature flange 76 and the second low-temperature flange 79 have already been cooled by the continuous operation of the refrigerator, and, therefore the cool-down time of the cooler 74 can be greatly shortened.

During the operation of the cooler 74, the helium gas always flows through the gap 72a between the sleeve 18 and the first and second cold stages 13 and, 14 of the expander 10, and therefore, the thermal resistance during that time is much lower than when the helium gas is stationary. Therefore, the thermally-conductive members 5c and 6c thermally integrated with the sleeve 18 are cooled to lower temperatures. Therefore, the thermal shield tubes 5a and 6a are cooled to lower temperatures, and the thermal shield effect is enhanced, thereby reducing the amount of evaporation of the liquid helium in the liquid helium vessel 4. Further, since the thermally-conductive members 5b and 6b are also cooled to lower temperatures, the cooling temperature of the first and second heat station 33 and 38 (FIG. 2) of the cooler 74 are lowered, so that the amount of liquefaction cooling of the cooler 74 is increased. Therefore, even if the power for operating the refrigerator and the cooler is suppressed, the evaporation gas of the liquid helium can be re-liquefied, thereby saving the electric power cost for the operation.

Figure 5:
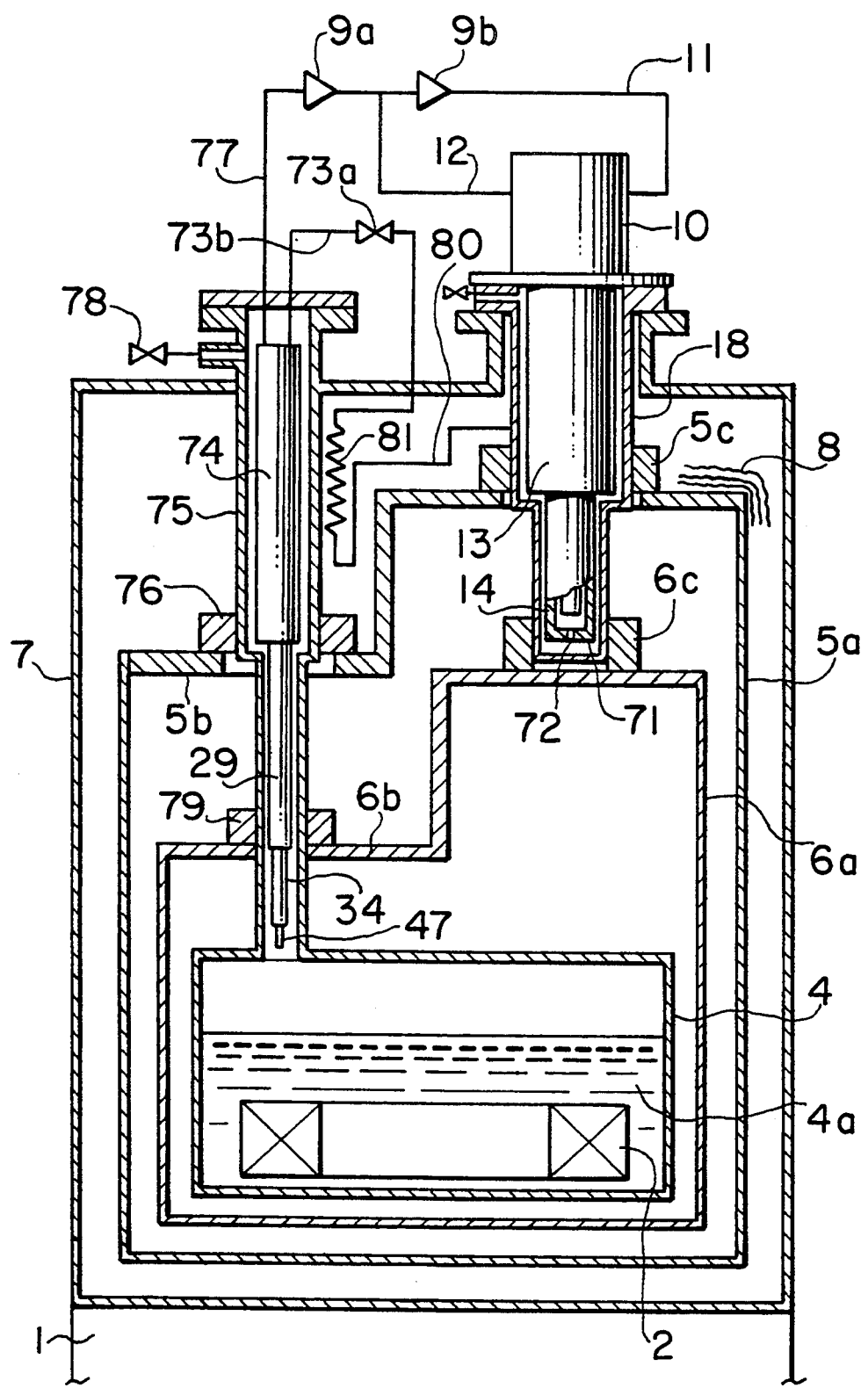
FIG. 5 is a cross-sectional view of a fourth embodiment of the invention.

The embodiment of FIG. 5 differs from the embodiment of FIG. 4 in that helium gas, extracted from a low-temperature end of a refrigerator, is fed to a pipe 80, connected to a sleeve 18, through a gap between a first cold station 13 and the sleeve 18, and is further fed to a pie 73b through a heat exchanger 81, for example, of the coiled pipe type thermally integrated with an outer surface of an insertion port 75. In this embodiment, the heat, which intrudes, due to thermal conduction, from an ordinary-temperature portion to a low-temperature portion of the insertion portion 75 along the wall of the insertion port 75, is eliminated by the low-temperature helium gas in the heat exchanger 81, thereby further enhancing the cooling performance of a cooler 74.

Figure 6:
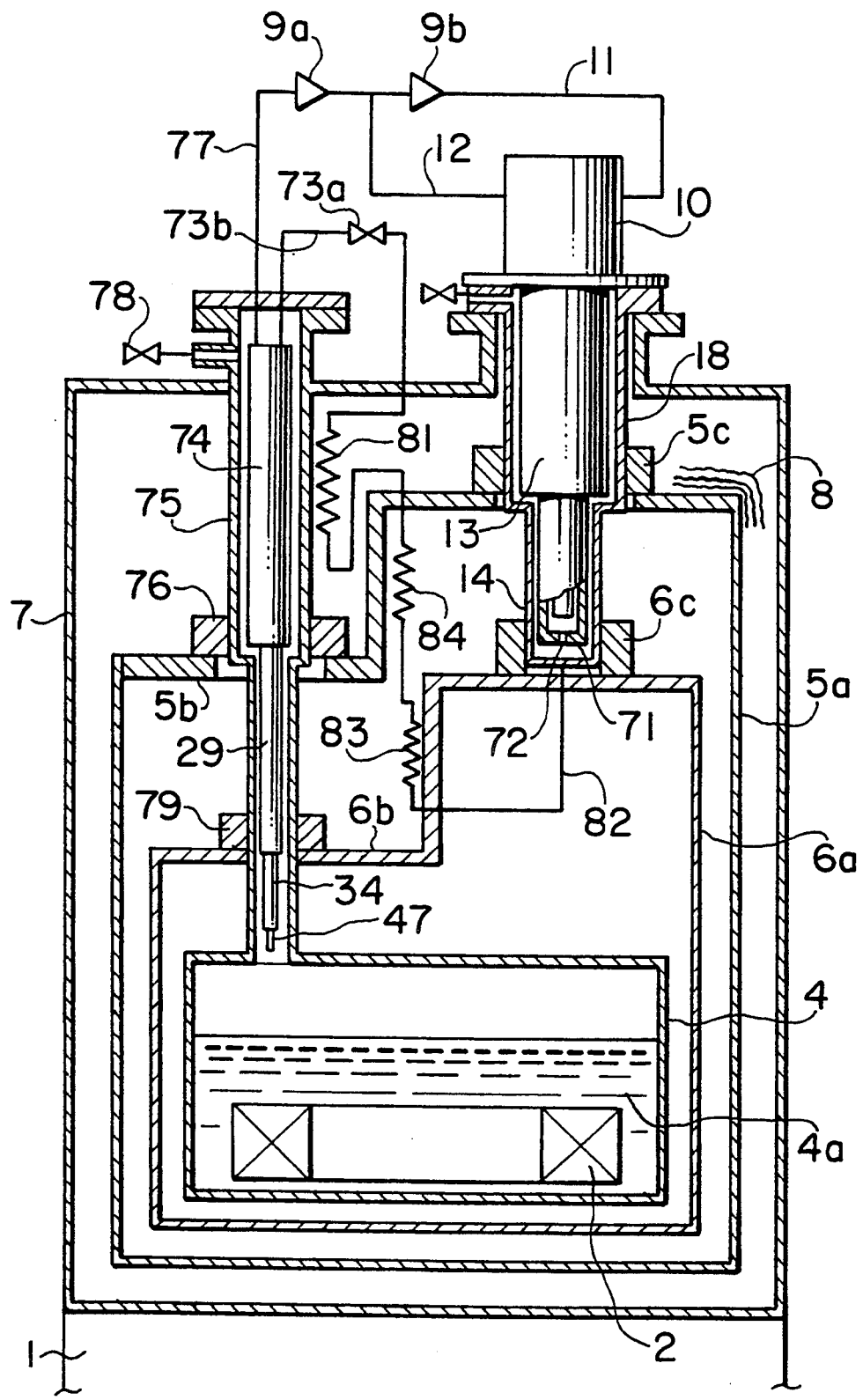
FIG. 6 is a cross-sectional view of a fifth embodiment of the invention.

The embodiment of FIG. 6 differs from the embodiment of FIG. 4 in that helium gas, extracted from a low-temperature end of a refrigerator, is fed to a pipe 82 through a sleeve below a second cold station 14, and then is fed through heat exchangers 83 and 84, for example, of the coiled pipe type, respectively thermally integrated with thermal shield tubes 6a and 5a, and then is fed to a pipe 73b through a heat exchanger 81. In the embodiment of FIG. 6, since the thermal shield tubes 6a and 5a can be cooled directly by the helium gas extracted from the low-temperature end of the refrigerator, the thermal shield tubes 6a, 5a can be cooled to lower temperatures. Therefore, the amount of evaporation of the liquid helium can be reduced, and the cooling load of a cooler 74 can be reduced, thereby reducing the operating power and the running cost. In this embodiment, even if thermally-conductive members 5c and 6c are omitted, thermally-conductive members 6b and 5b can be cooled, and, therefore, the position of mounting of a sleeve 18 can be determined regardless of the positions of the thermally-conductive members 6b and 5b, so that a vacuum vessel 7 can have a degree of freedom in its construction.

In the above described embodiments, although the first and second heat stations of the cooler are cooled by the thermal condcution of the helium gas residing in the gap in the insertion port, soft metal such as, for example, indium, may be provided in this gap to enhance the cooling, in which case the cooling performance of the cooler can be improved. In this case, if each the first and second heat stations has a conical shape, and also if those portions of the insertion port corresponding to the first and second heat stations have a conical shape corresponding to the shape of the first and second heat stations, a better cooling effect can be obtained. If the two heat stations have the same diameter in the case where they have a cylindrical shape, the inner diameter of the insertion port may be uniform in its axial direction, in which case the construction of the insertion port is simple, thereby reducing the manufacturing cost.

Figure 7:
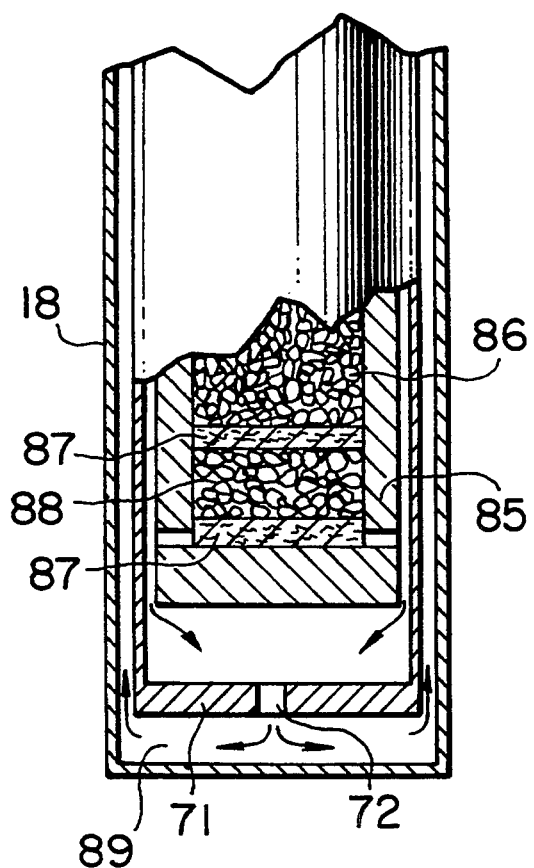
FIG. 7 is a cross-sectional view of a low-temperature end portion of a refrigerator used in a sixth embodiment of the invention.

In the embodiment of FIG. 7, filters 87 and 87, of a copper wire or the like, are provided in a displacer 85 at a low-temperature end of a refrigerator, below a cooling material 86, such as, for example, a compound or alloy of lead or rare earth metal, deposited in the displacer 85. An adsorbent 88, such as, for example, activated charcoal and molecular sieves, is provided between the filters 87 and 87 such as, for example, copper mesh. In the embodiment of FIG. 7, the adsorbent 88, cooled to a temperature of below 15K by the helium gas in the refrigerator, particularly removes the hydrogen components of the impurities, so that the purity of the hellium gas extracted from a narrow hole 72 is further increased. Therefore, the amount of the impurities accumulated or deposited in the cooler is further decreased, and the length of time between overhaul of the cooler is increased, and, therefore, the operating cost can be reduced. In the embodiment of FIG. 7, although the adsorbent 88 is provided in the displacer 85, the adsorbent 88 may be provided in a space 89 between a bottom of a cylinder 71 of the refrigerator and a bottom of a sleeve 18, in which case similar effects can be achieved.

The embodiment of FIG. 8 differs from the embodiment of FIG. 2 in that an adsrobent 90, such as, for example, activated charcoal and molecular sieves, is provided in a space of each high-pressure flow path respectively disposed before first and second heat stations 33 and 38 and a JT valve of a cooler. The impurities contained in the helium gas are removed by the adsorbents 90 cooled to the respective temperature levels, thereby preventing the contamination of the various heat transfer plates and the clogging of the JT valve. Therefore, the length of time between overhauls of the cooler can be further prolonged, and the operating cost can be reduced. The absorbent 90 can be simultaneously removed when the overhaul is to be carried out, and can be regenerated at an ordinary temperature, and, therefore, the overhaul can be easily carried out in shorter time.

Figure 9:
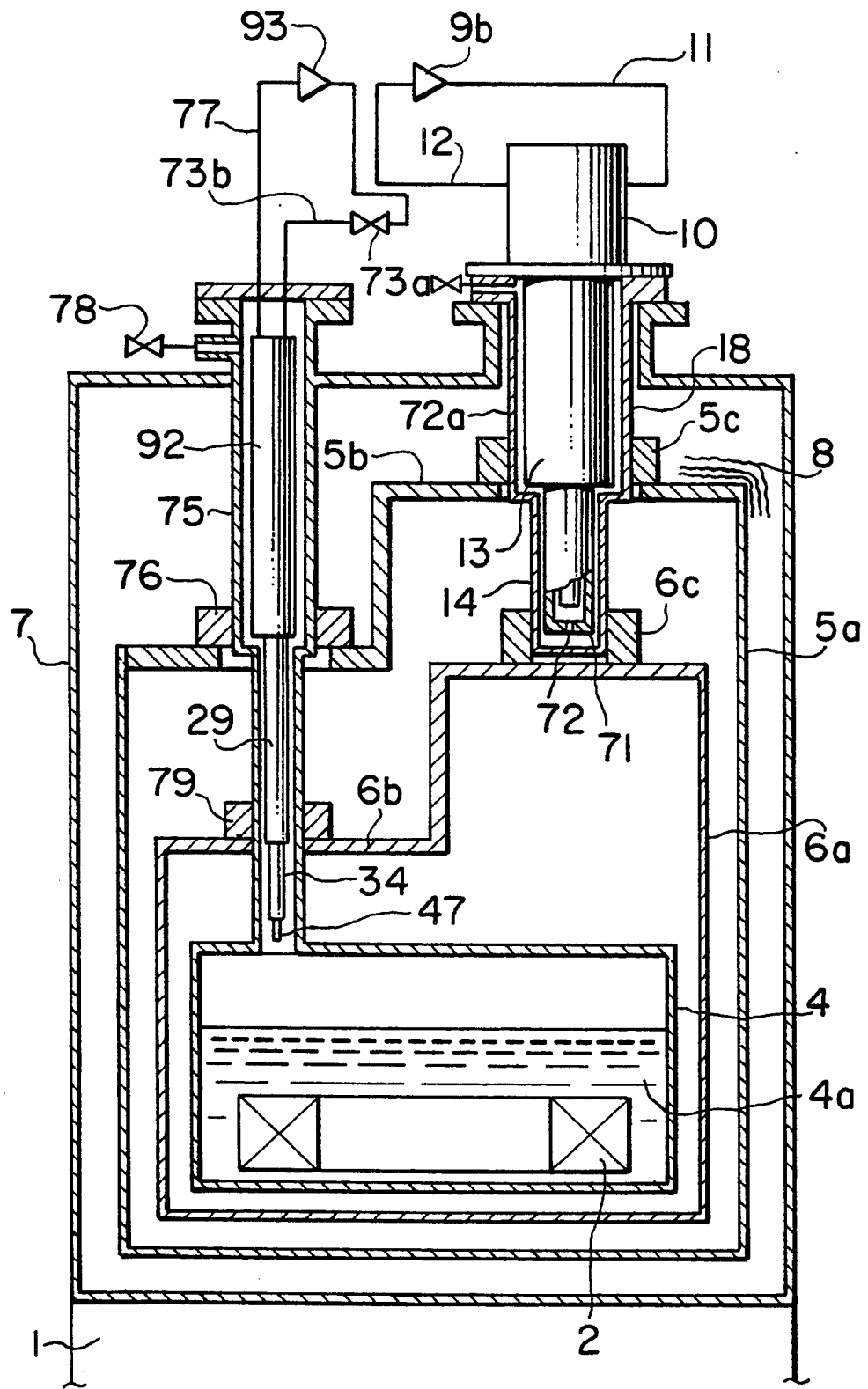
FIG. 9 is a cross-sectional view of an eighth embodiment of the invention.

The embodiment of FIG. 9 differs from the embodiment of FIG. 4 in that a cooler 92 containing the adsorbents shown in FIG. 8 is used, and an independent helium compressor unit 93 supplies helium gas to the cooler 92 with the helium gas not being supplied from a low-temperature end of a refrigerator. In the embodiment FIG. 9, since the impurities in the helium gas supplied from the helium compressor unit 93 can be removed by the adsorbents contained in the cooler 92, the contamination and clogging of the cooler 92 can be prevented. Therefore, the length of time between overhauls of the cooler can be prolonged, and, since the refrigerator is independently provided, the refrigerator can be independently operated independently even when a trouble occurs in the compressor unit 93, thereby keeping the amount of evaporation of the liquid helium to a minimum level.

In the above embodiments, although the degree of opening of the JT valve can be controlled from the ordinary-temperature portion, the JT valve may be replaced by a fixed throttle-orifice provided in the low-temperature end of the cooler, in which case similar effects can be achieved.

Figure 10:
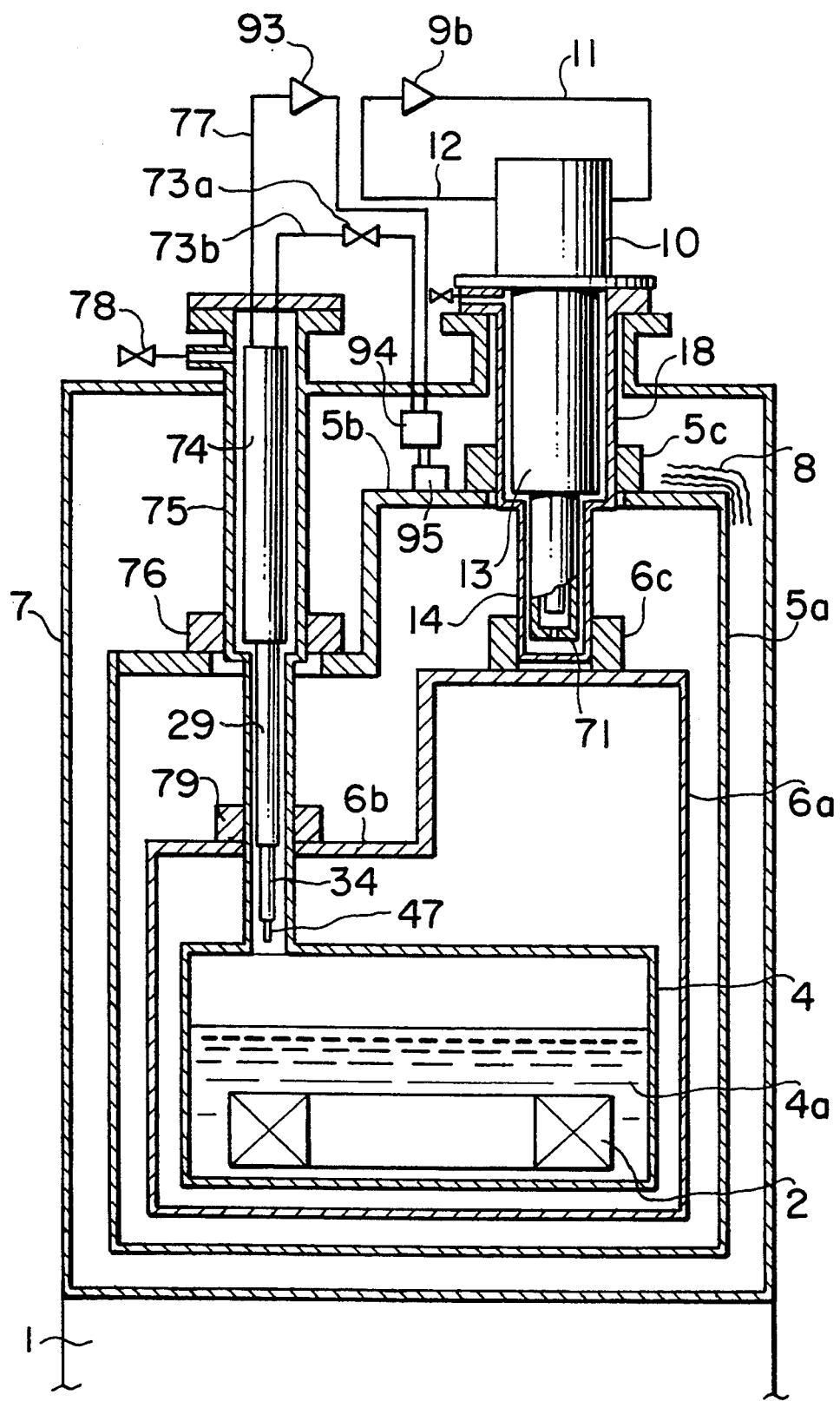
FIG. 10 is a cross-sectional view of a ninth embodiment of the invention.

The embodiment of FIG. 10 differs from the embodiment of FIG. 4 in that helium gas, supplied from an independent compressor unit 93 for a cooler 74, is cooled by a heat exchanger 94, and is then fed to an adsorbent device 95, integrated with a thermally-conductive member 5a, so as to remove impurities in the helium gas by an adsorbent filled in the adsorbent device 95, and then the helium gas passes through the heat exchanger 94 to be restored into an ordinary temperature, and then is fed to a pipe 73b. In embodiment of FIG. 10, the helium gas containing less impurities can be supplied to the cooler, and therefore the length of time between overhauls of the cooler can be prolonged as compared with the conventional construction.

In the above embodiments, although the liquid helium cools the superconducting magnet serving as the object to be cooled, the object to be cooled may be a Josephson electric device, a SQUID device, a sensor or any other suitable device, in which case similar effects can be achieved.

As described above, in the 3rd to 9th embodiments of FIGS. 4–10, helium gas containing less impurities is supplied to the cooler which performs the re-liquefying function without the use of a mechanically-operated cold-generating means therein, and this cooler can be provided separately from the refrigerator A for cooling the thermal shield tubes. Therefore, by a suitable selection from these embodiments, the following advantages can be achieved:

(1) Since only the cooler can be overhauled without stopping the operation of the refrigerator, a large increase of the amount of evaporation of the liquid helium during this overhaul can be prevented, thereby reducing the maintenance cost greatly.

(2) Since only the cooler can be detached without destroying the vacuum of the cryostat, the maintenance cost can be greatly reduced.

(3) Since the cooler can be mounted in the liquid helium supply port, a cooler of an ordinary temperature can be pre-cooled directly by the evaporation gas of the liquid helium after the cooler is attached. Therefore, the cool-down time for the cooler can be reduced.

(4) There is no need to incorporate a self-cooling refrigerator in the cooler, and no mechanically-operated cold-generating means is contained. Therefore, the manufacturing cost of the cooler can be reduced.

(5) Since the helium gas, extracted from the low-temperature end of the refrigerator and including a little amount of the impurities, is supplied into the cooler, the length of time between overhauls of the cooler can be prolonged, thereby advantageously reducing the running cost.

(6) Since the cooler can contain the adsorbent device for removing the impurities, the contamination and clogging of the cooler can be prevented, and, therefore, the length of time between overhauls can be prolonged, and also the regeneration of the adsorbent can be easily carried out, thereby further reducing the operating cost.

(7) The adsorbent can be provided in the pipe communicating the low-temperature end of the refrigerator with the inlet of the cooler. The concentration of the impurities in the helium gas can be further decreased, thereby further prolonging the length of time between overhauls of the cooler.

(8) Since the helium gas, extracted from the low-temperature end of the refrigerator, flows through the gap between the sleeve of the refrigerator and the cold stations of the refrigerator, the thermal resistance between the cold stations and the thermally-conductive members integrated with the sleeve is small, so that the temperatures of the thermal shield tubes as well as the temperatures of the heat stations of the cooler are lower. Therefore, the amount of evaporation of the liquid helium is reduced, and the cooling performance of the cooler is enhanced, and the amount of electric power consumed for operating the refrigerator and the cooler is reduced, thereby reducing the operating cost.

As described above, in the present invention, the high-pressure helium gas containing a very little amount of impurities can be supplied in an ordinary-temperature condition as the operating fluid of the cooler. Therefore, the refrigerator and the cooler can be separated from each other, and can be overhauled independently of each other. Therefore, the overhaul cost can be reduced. Also, since the cooling temperature of the cooler can be further lowered, the liquefaction cooling performance of the cooler can be enhanced. Therefore, the cost for operating the compressor of the liquefaction refrigerator can be reduced. Therefore, a highly reliable liquefaction cryostat can be provided with a refrigerator which contains superconducting magnet.

What is claimed is:

1. A cryostat for containing an object to be cooled, said cryostat including a thermally insulated vessel and a liquefaction refrigeration means having a low temperature end for cooling said object to be cooled,
    wherein said liquefaction refrigeration means comprises a cooler and a refrigerator, said cooler and said refrigerator being thermally connected to each other by detachable thermal connection means and being respectively inserted into a cooler accommodating portion and a refrigerator accommodating portion of the cryostat,
    said refrigerator being adapted to cool said cooler, wherein said cooler thereby generates, at said low temperature end, a temperature lower than a cooling temperature of said refrigerator,
    and wherein said detachable thermal connection means allows said cooler and said refrigerator to be independently attached to and detached from respective accommodating portions of the cryostat.

2. A cryostat according to claim 1, wherein said cooler comprises a heat exchanger and an expansion valve, said refrigerator includes a mechanically-operated cold-generating means.

3. In a cryostat with a liquefaction refrigerator which contains an object to be cooled, as well as a low-temperature end of said liquefaction refrigerator for cooling said object to be cooled, is contained in a thermally-insulated space;
    the improvement wherein said liquefaction refrigerator comprises a cooler and a refrigerator; said cooler comprises, as main components, a heat exchanger and an expansion valve; said refrigerator includes mechanically-operated cold-generating means; a compressor for supplying an operating fluid to said refrigerator is provided at an ordinary-temperature portion; an adsorbent device for adsorbing impurities in said operating fluid is provided at a low-temperature end of said refrigerator disposed in said thermally-insulated space; there is provided a communication passage for supplying said operating fluid, passed through said adsorbent device, from an ordinary-temperature end of said cooler; and within said thermally-insulated space, said cooler and said refrigerator are thermally connected together by releasable thermally-conductive means.

* * * * *